United States Patent
Perelshtein et al.

(10) Patent No.: US 11,977,954 B2
(45) Date of Patent: May 7, 2024

(54) METHOD, APPARATUS AND COMPUTER PROGRAM PRODUCT FOR DETERMINING THE COMPONENT OF A MAGNETIC FIELD IN A PREDETERMINED DIRECTION

(71) Applicant: Terra Quantum AG, St. Gallen (CH)

(72) Inventors: Michael Perelshtein, St. Gallen (CH); Nikita Kirsanov, St. Gallen (CH); Vladislav Zemlyanov, St. Gallen (CH)

(73) Assignee: Terra Quantum, St. Gallen (CH)

( * ) Notice: Subject to any disclaimer, the term of this patent is extended or adjusted under 35 U.S.C. 154(b) by 522 days.

(21) Appl. No.: 17/211,369

(22) Filed: Mar. 24, 2021

(65) Prior Publication Data

US 2021/0302513 A1 Sep. 30, 2021
US 2022/0308134 A2 Sep. 29, 2022

(30) Foreign Application Priority Data

Mar. 25, 2020 (EP) ..................................... 20165571

(51) Int. Cl.
*G06N 10/00* (2022.01)
*G01R 33/10* (2006.01)
(Continued)

(52) U.S. Cl.
CPC ............. *G06N 10/00* (2019.01); *G01R 33/10* (2013.01); *G06F 17/14* (2013.01); *G06F 17/18* (2013.01);
(Continued)

(58) Field of Classification Search
CPC .... G06N 10/00; G01R 33/10; G01R 33/0064; G06F 17/14; G06F 17/18
See application file for complete search history.

(56) References Cited

U.S. PATENT DOCUMENTS 11,651,263 B2 * 5/2023 Martinis ............... G06F 18/214
706/45
2007/0250280 A1 10/2007 Beausoleil et al.
(Continued)

FOREIGN PATENT DOCUMENTS

CA 3067246 A1 * 1/2019 ............... G01R 1/28
CN 110162536 A 8/2019
(Continued)

OTHER PUBLICATIONS

Nusran et al., "High Dynamic Range Magnetometry with a Single Electronic Spin in Diamond," *Nature Nanotechnology*, 7(2): 109-113 (2011).
(Continued)

*Primary Examiner* — Christopher E Mahoney
(74) *Attorney, Agent, or Firm* — Leydig, Voit & Mayer, Ltd.

(57) ABSTRACT

The invention relates to a method for determining the component of a magnetic field in a predetermined direction. The method comprises preparing a quantum system in a coherent superposition state (S1), letting the quantum system evolve for a delay time period (S2) and performing a readout operation and a projective measurement on the quantum system (S3). The steps (S1, S2, S3) are iteratively repeated in an iteration loop, wherein the delay time period increases linearly by the same time increment after each iteration. The method further comprises determining the component of the magnetic field in the predetermined direction according to the outcome of the projective measurements (S4).

15 Claims, 4 Drawing Sheets

(51) Int. Cl.
*G06F 17/14* (2006.01)
*G06F 17/18* (2006.01)
*G01R 33/00* (2006.01)
*G06N 7/01* (2023.01)
*G06N 10/40* (2022.01)

(52) U.S. Cl.
CPC ............ *G01R 33/0064* (2013.01); *G06N 7/01* (2023.01); *G06N 10/40* (2022.01)

(56) References Cited

U.S. PATENT DOCUMENTS

| | | |
|---|---|---|
| 2011/0114920 A1 | 5/2011 | Roshen et al. |
| 2017/0104493 A1 | 4/2017 | Goto |
| 2019/0179871 A1 | 6/2019 | Granade et al. |

FOREIGN PATENT DOCUMENTS

| | | |
|---|---|---|
| CN | 110612540 A | 12/2019 |
| CN | 110738321 A | 1/2020 |
| JP | 2015-035129 A | 2/2015 |
| WO | WO 2019/005206 A1 | 1/2019 |

OTHER PUBLICATIONS

Waldherr et al., "High-dynamic-range magnetometry with a single nuclear spin in diamond," *Nature Nanotechnology*, 7: 105-108 (2011).
Australian Patent Office, Examination Report No. 1 in Australian Patent Application No. 2021201695 (dated Apr. 19, 2022).
Danilin et al., "Quantum-enhanced magnetometry by phase estimation algorithms with a single artificial atom," *npj Quantum Information*, 4(1): 1-8 (Jun. 29, 2018).
Degen et al., "Quantum sensing," *Reviews of Modern Physics*, 89(3): 035002.1-035002.39 (Jul.- Sep. 2017).
Kristen et al., "Amplitude and frequency sensing of microwave fields with a superconducting transmon qudit," *npj Quantum Information*, 6(1): 1-6 (2020).
Pezzé et al., "Quantum metrology with nonclassical states of atomic ensembles," *Reviews of Modern Physics*, 90(3): 1-76 (2018).
Shlyakhov et al., "Quantum metrology with a transmon qutrit," *Physical Review* A, 97(2): 1-10 (2018).
European Patent Office, Extended European Search Report in European Patent Application No. 20165571.9, 10 pp. (dated Oct. 8, 2020).
Japanese Patent Office, Notification of Reason for Rejection in Japanese Patent Application No. 2021-050027 (dated Jun. 7, 2022).

* cited by examiner

US 11,977,954 B2

METHOD, APPARATUS AND COMPUTER PROGRAM PRODUCT FOR DETERMINING THE COMPONENT OF A MAGNETIC FIELD IN A PREDETERMINED DIRECTION

CROSS-REFERENCE TO RELATED APPLICATIONS

This patent application claims priority from European Patent Application No. 20165571.9, filed Mar. 25, 2020, which is incorporated herein by reference for all purposes.

FIELD OF THE DISCLOSURE

The present disclosure relates to a method, apparatus and computer program product for determining the component of a magnetic field in a predetermined direction.

BACKGROUND OF THE INVENTION

In classical metrology, a method for determining a magnetic field value typically involves several independent measurements. Thereby, the scaling behaviour of the determination uncertainty is given by the standard quantum limit (or shot noise limit) $\delta x \propto 1/R^\alpha$ with $\alpha = \frac{1}{2}$, where R denotes a measure for the required resources, e.g., the number of measurements, a characteristic measurement time or a characteristic measurement energy. However, it is conjectured that in the framework of quantum metrology the standard quantum limit can be overcome and the precision of the method can be improved considerably using quantum resources.

For example, phase estimation protocols have been proposed based on the Fourier algorithm or the Kitaev algorithm for achieving the fundamental Heisenberg scaling limit of quantum metrology with the scaling exponent $\alpha = 1$. According to these protocols a sequence of Ramsey experiments is carried out which, however, requires a delicate fine-tuning of various parameters for each experiment in the sequence.

Moreover, protocols based on the Fourier and Kitaev algorithm are optimized for the determination of discrete magnetic fields, wherein at least one component of the magnetic field can only take on discrete values. Furthermore, the Ramsey delay time in each Ramsey experiment shows an exponential scaling behaviour within the sequence. Therefore, a practical application of such protocols is strongly limited in the relevant situation, where the magnetic field strength may be continuously distributed and the quantum system suffers from dephasing and decoherence.

BRIEF SUMMARY OF THE INVENTION

The invention provides a method, apparatus and computer program product for determining the component of a magnetic field in a predetermined direction.

Thus, an object of the invention is to overcome such limitations and provide a simple and practical method, apparatus and computer program product for determining magnetic fields with high precision.

This object of the invention is achieved by the method, apparatus and computer program product as described in claims 1, 9 and 15. Advantageous developments and embodiments are described in the dependent claims.

The invention relates to a method for determining the component of a magnetic field in a predetermined direction. The method comprises preparing a quantum system in a coherent superposition state (preparation step), letting the quantum system evolve for a delay time period (evolution step) and performing a readout operation and a projective measurement on the quantum system (readout step). The preparation step, the evolution step and the readout step are iteratively repeated in an iteration loop, wherein the delay time period increases linearly by the same time increment after each iteration. The method further comprises determining the component of the magnetic field in the predetermined direction according to the outcome of the projective measurements (determination step).

The proposed method allows determining the component of a magnetic field with high precision. Thereby, the preparation of the quantum system in a coherent superposition state and the linear increase of the delay time period after each iteration ensures the quantum advantage compared to classical metrological protocols. Moreover, since the delay time period increases only linearly, a large number of iterations and a large total phase accumulation time can be realized. Consequently, a high determination accuracy can be achieved and the proposed method can be carried out efficiently even in the case of continuous magnetic fields and in the presence of dissipation and decoherence. Moreover, the proposed method is far less complex and requires less experimental and computational resources. In particular, the delay time periods of the iteration loop may be predetermined.

The origin or source of the magnetic field to be determined may be known and the predetermined direction may be chosen accordingly. For example, the electromagnetic radiation characteristics of the origin or source may be known in advance and the predetermined direction may be chosen according to the electromagnetic radiation characteristics.

Preferably, the coherent superposition state is the same in each iteration of the iteration loop. In particular, the coherent superposition state may be prepared identically in each preparation step, e.g., by using the same control pulse frequencies in each iteration. For that purpose, the quantum system may be initialized in the ground state before each iteration of the preparation step. For example, the quantum system may be cooled into the ground state after each projective measurement. The quantum system may also be forced into the ground state after each projective measurement on a short time scale using a reset operation carried out before the next iteration starts in the iteration loop.

In the preparation step, the preparing of the quantum system in the coherent superposition state may be achieved using a control pulse, e.g., generated by a signal generator. The coherent superposition state may be the eigenstate of a component of the spin operator in a direction perpendicular to the predetermined direction with the largest eigenvalue in terms of its absolute value. Preferably, the coherent superposition state corresponds to the maximum modulus spin-projection in a direction perpendicular to the predetermined direction. Preparing the quantum system in such a coherent superposition state allows determining the component of the magnetic field with high precision in a large measurement range.

Most preferably, the coherent superposition state may correspond to an unbalanced superposition of at least three states with respective amplitudes. Thereby, at least two amplitudes may differ from one another in terms of their absolute value. A coherent superposition state composed of a large number of pure states allows utilizing a larger spin projection in the predetermined direction and may further improve the sensitivity of the quantum system.

The evolution step may comprise an interaction of the quantum system with the magnetic field in the predetermined direction. In the evolution step, a phase associated with each pure state forming the coherent superposition state may accumulate during the delay time period. Thereby, the accumulated phase may depend on the component of the magnetic field in the predetermined direction.

Preferably, the readout operation corresponds to a Fourier transform of the state of the quantum system. The readout operation may be performed on the quantum system before the projective measurement is carried out. Specifically, the readout operation may be performed using a readout pulse, e.g., generated by the signal generator. Preferably, the readout operation is carried out identically in each iteration, e.g., by using the same readout pulse frequencies in each iteration.

The projective measurement may correspond to a measurement of the spin polarization of the quantum system in the predetermined direction. Correspondingly, a measurement result of the projective measurement may be a component of the spin of the quantum system in the predetermined direction. Preferably, the projective measurement determines a pure state of the quantum system after the readout operation. Thereby, the pure state corresponds to one of the states forming the coherent superposition state. The projective measurement of the quantum system may be performed using a probe pulse, e.g., generated by the signal generator. Preferably, the projective measurement is a quantum non-demolition measurement.

The number of iterations in the iteration loop may be predetermined. The number of iterations may be at least three. Preferably, the number of iterations is at least 20. Most preferably, the number of iterations is at least 50.

The iteration loop may also terminate when a desired determination accuracy is achieved. The desired determination accuracy may be compared to an inverse of the width of a probability distribution of the component of the magnetic field that is determined or updated after each iteration. For that purpose, at least part of the determination step may be iteratively repeated inside the iteration loop.

The number of iterations may be determined such that the iteration loop terminates when a delay time period becomes larger than a coherence time of the quantum system. The number of iterations may also be determined such that the iteration loop terminates when the total phase accumulation time becomes larger than the coherence time of the quantum system, preferably larger than at least three times a coherence time of the quantum system, most preferably larger than at least ten times a coherence time of the quantum system. The total phase accumulation time may be defined as the sum of the delay time periods of all iterations in the iteration loop.

The method may further comprise estimating an initial determination uncertainty for the component of the magnetic field in the predetermined direction. The time increment may be determined according to the initial determination uncertainty. Specifically, the time increment may correspond to the inverse of the initial determination uncertainty.

The method may further comprise determining an initial probability distribution of the component of the magnetic field. The initial probability distribution may be determined as a constant or a uniform distribution (over a large range of magnetic fields), e.g. in the absence of prior knowledge about the component of the magnetic field. The initial probability distribution may also be determined to be a Gaussian function. The mean of the Gaussian function may correspond to an estimated value for the component of the magnetic field. The standard deviation of the Gaussian function may correspond to the estimate of the initial determination uncertainty.

The estimated value for the component of the magnetic field and the estimated initial determination uncertainty may reflect the state of knowledge about the magnetic field before the first iteration of the iteration loop is actually carried out. Exemplary, the estimated value for the component of the magnetic field and the estimated initial determination uncertainty may be obtained in advance from a classical measurement protocol or from a numerical simulation or from an analytic argument.

The method may further comprise estimating an expected information gain. Preferably, the delay time period of the first iteration is determined according to the estimate of the expected information gain. The estimate of the expected information gain may correspond to the expected information gain after the first iteration. Thereby, the information gain may be defined to correspond to a measure for the gain in knowledge about the component of the magnetic field in the predetermined direction obtained from a projective measurement. The expected information gain may be estimated according to a simulation of the dynamical evolution of the quantum system using a Hamiltonian and/or a Lindblad master equation (see further below). The delay time period of the first iteration in the iteration loop may then be determined as the saturation time of the information gain expected from the projective measurement in the first iteration.

The component of the magnetic field may be determined using a Bayesian learning algorithm. Preferably, for each iteration a probability distribution of the component of the magnetic field may be updated according to Bayes theorem. For the first iteration, an update of the initial probability distribution may be determined. An update may comprise multiplying a probability distribution of the component of the magnetic field with a probability distribution of finding the quantum system in a pure state after the readout operation. The probability distribution of finding the quantum system in a pure state after the readout operation used in the update may be chosen/selected according to the outcome of the projective measurement from a set of predetermined (calculated) probability distributions obtained from a simulation of the dynamical evolution of the quantum system (see further below). In other words, the outcome of a projective measurement determines which one of the predetermined probability distributions of finding the quantum system in a pure state is used in the update.

The width of the probability distribution of the component of the magnetic field may correspond to the determination uncertainty of the proposed method. By updating the probability distribution of the component of the magnetic field using Bayes theorem, the determination uncertainty may decrease from iteration to iteration reflecting the information gain obtained after each iteration and reflecting an increase of the determination accuracy. In particular, the component of the magnetic field may be determined from an update of the probability distribution of the component of the magnetic field after the last iteration in the iteration loop. In particular, the component of the magnetic field may be determined as the mean value of the probability distribution of the component of the magnetic field updated according to Bayes theorem after the last iteration in the iteration loop.

The method may further comprise simulating a dynamical evolution of the quantum system using a Lindblad master equation. The Lindblad master equation may constitute a model for the incoherent dynamics of the quantum system. The Lindblad master equation may comprise a decoherence rate and/or at least one dissipation rate and/or at least one dephasing rate of the quantum system. The at least one decoherence rate and/or at least one dissipation rate and/or at least one dephasing rate of the quantum system may be pre-determined, e.g., measured or simulated in advance.

The method may also comprise simulating a dynamical evolution of the quantum system using a Hamiltonian. The Hamiltonian may be a model for the coherent dynamics of the quantum system. The Hamiltonian model may comprise energies or energy level spacings of the quantum system. Their dependence on the component of a (reference) magnetic field in the predetermined direction may be pre-determined, e.g., measured or simulated in advance. Preferably, the dynamical evolution of the quantum system is simulated during the preparation step, the evolution step and the readout step.

The method may further comprise determining the probability distributions of finding the quantum system in a pure state according to the simulation of the dynamical evolution of the quantum system. In particular, these probability distributions may be calculated as a function of the component of a (reference) magnetic field in the predetermined direction (treated as a variable). The probability distributions may be determined for each pure state forming the coherent superposition state and may be stored electronically as a function or algebraic expression in an electronic storage unit.

With the simulation of the dynamical evolution of the quantum system as outlined above, the expected information can be estimated and the delay time period of the first iteration can be determined. Moreover, a set of probability distributions of finding the quantum system in a pure state after the readout operation can be calculated and used in the Bayesian learning algorithm in order to update the probability distribution of the magnetic field.

With the proposed method the Heisenberg scaling limit can be reached for a total phase accumulation time comparable to the coherence time of the quantum system. A large number of iterations can be realized in practice and the component of the magnetic field can be determined with high precision. In particular, a finite coherence time does not pose a stringent limitation to the efficiency of the proposed method until the delay time period of the last iteration becomes comparable to the coherence time.

The invention also relates to an apparatus for determining the component of a magnetic field in a predetermined direction. The apparatus comprises a quantum system and a control and measurement unit.

The control and measurement unit is configured to carry out the steps of preparing the quantum system in a coherent superposition state (preparation step) and letting the quantum system evolve for a delay time period (evolution step) and performing a readout operation and a projective measurement on the quantum system (readout step), and iteratively repeating the preparation step, the evolution step and the readout step, wherein the delay time period increases linearly by the same time increment after each iteration. The control and measurement unit is further configured to carry out the step of determining the component of the magnetic field in the predetermined direction according to the outcomes of the projective measurements.

The quantum system may correspond to a qubit or a d-dimensional qudit with d>2. The qubit or qudit states may form the computational basis and may correspond to the eigenstates of the component of the spin operator in the predetermined direction, wherein the spin may correspond to the magnetic moment of the quantum system. In particular, the magnetic moment of the quantum system may be the coupling constant of the quantum system interacting with the magnetic field in the predetermined direction. The qubit or qudit states may be energy eigenstates of the quantum system. More specifically, the quantum system may correspond to a qutrit, i.e., a qudit with d=3. The three qutrit states may then correspond, respectively, to the three components of the magnetic moment of the quantum system projected on the predetermined direction.

Preferably, the quantum system comprises an experimentally controllable energy spectrum, wherein the energy level spacings in at least a part of the energy spectrum depend identically on the component of the magnetic field in the predetermined direction. From said part of the energy spectrum the states forming the coherent superposition state, e.g., the qudit states, may be chosen as the computational basis. Here, an identical dependency may mean that the energy level spacings as a function of the component of the magnetic field in the predetermined direction are shifted with respect to each other by a constant energy shift. In particular, the constant energy shift does not depend on the component of the magnetic field. This may ensure linear phase accumulation dynamics.

The quantum system may be a superconducting circuit. More specifically, the quantum system may comprise at least one transmon device, a charge qudit and/or a flux qudit. Alternatively, the quantum system may comprise a single atom in a trap or a single ion in a trap, a single semiconductor quantum dot, a photon or polariton inside a resonator or waveguide, or a Nitrogen-vacancy center in diamond.

The control and measurement unit may further comprise at least one signal generator configured to generate control pulses for preparing the quantum system in the coherent superposition state. The signal generator may also be configured to generate readout pulses for performing readout operations on the quantum system. The signal generator may also be configured to generate probe pulses for performing projective measurements on the quantum system. Specifically, the signal generator may comprise an arbitrary wave generator. The control pulses and readout pulses may be multi-tone pulses.

The control and measuring unit may also comprise coupling means, e.g., configured to couple the signal generator with the quantum system. The control pulses or the readout pulses may interact with the quantum system directly via such coupling means. The probe pulses may interact with the quantum system indirectly via such coupling means. For example, the coupling means may comprise a transmission line, a transmission line resonator, a gate or a flux line. The control and measurement unit may further comprise at least one detector or a detector unit. The at least one detector or detector unit may also be coupled to the quantum system. Preferably, the control and measurement unit is configured to perform quantum non-demolition measurements on the quantum system.

The control and measurement unit may further comprise a computing unit, an electronic evaluation unit and/or an electronic storage unit. The electronic storage unit may be part of the computing or the electronic evaluation unit. The electronic evaluation unit may be part of the computing unit. The computing unit or the electronic evaluation unit may comprise at least one of a processor, a CPU (central processing unit), a GPU (graphical processing unit). The computing unit may also be remotely connected to the evaluation unit. The computing unit or the evaluation unit may also be remotely connected to the control and measurement unit.

The invention is also related to a computer program product comprising a computer program (or a sequence of instructions) using software means for performing the method for determining the component of a magnetic field in a predetermined direction, when the computer program runs in a computing unit. At least parts of the computer program can be formulated in a script language or a compiler language. The computer program can be stored directly stored in an internal memory, a memory unit or the data storage unit of the evaluation unit. The computer program product can be stored in machine-readable data carriers, preferably digital storage media.

In summary, a simple and practical method, apparatus and computer program product for determining magnetic fields with remarkable sensitivity and precision are established. In particular, a near Heisenberg scaling can be achieved in situations where known metrological procedures become ineffective. Thereby, a component of a magnetic field can be determined with high precision using only modest computational and hardware resources.

The invention may find applications in a wide range of technology. Exemplary, the invention may be used to determine magnetic fields originating from single atoms and ions, biological probes or quantum engineered systems, e.g., embedded in a quantum computer or quantum simulator.

BRIEF DESCRIPTION OF THE DRAWINGS

Exemplary embodiments of the invention are illustrated in the drawings and will now be described with reference to FIGS. 1 to 7.

In the figures.

DETAILED DESCRIPTION OF THE INVENTION

Figure 1:
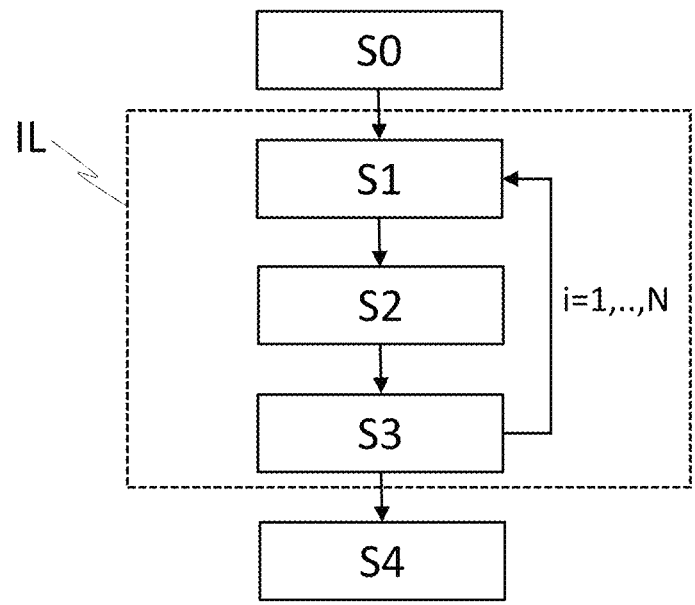
FIG. 1 shows a schematic flow diagram of an embodiment of the method.

FIG. 1 shows a schematic flow diagram of an embodiment of the method for determining the component of a magnetic field $H_m$ in a predetermined direction.

The method comprises a setup step S0. In the setup step S0, a coherent superposition state $|\psi^0\rangle$, a time increment $\Delta t$, a delay time period corresponding to a first iteration $t_1^L$ and a number of iterations N are determined. In the setup step S0, a quantum system Q is initially prepared in its ground state.

The method further comprises preparing the quantum system Q in the coherent superposition state $|\psi^0\rangle$ (preparation step S1), letting the quantum system Q evolve for the delay time period $t_i^L$ (evolution step S2) and performing a readout operation and a projective measurement on the quantum system Q (readout step S3). The preparation step S1, the evolution step S2 and the readout step S3 are iteratively repeated in the iteration loop IL, wherein the delay time period $t_i^L$ increases linearly by the same time increment $\Delta t > 0$ after each iteration, i.e., $t_i^L = t_1^L + (i-1)\Delta t$. The iteration loop IL is parameterized by the iteration loop index i=1, ..., N. The time period between the preparation step S1 and the readout operation in the readout step S3 is given by the delay time period $t_i^L$.

The method further comprises determining the component of the magnetic field in the predetermined direction according to the outcome of the projective measurements (determination step S4).

Figure 2:
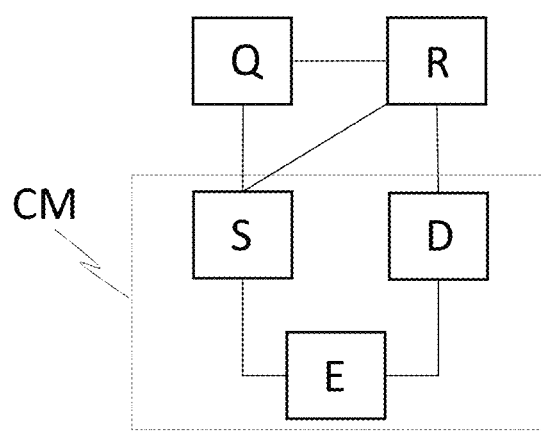
FIG. 2 shows a schematic diagram of an embodiment of the apparatus.

FIG. 2 shows a schematic diagram of an embodiment of an apparatus for determining the component of a magnetic field $H_m$ in a predetermined direction. The apparatus comprises a quantum system Q and a control and measurement unit CM. The apparatus further comprises a dilution refrigerator as a refrigerating unit (not shown) configured to cool the quantum system Q into its ground state.

The control and measurement unit CM is configured to carry out the steps of preparing the quantum system Q in the coherent superposition state $|\psi^0\rangle$ (preparation step S1) and letting the quantum system Q evolve for the delay time period $t_i^L$ (evolution step S2) and performing a readout operation and a projective measurement on the quantum system Q (readout step S3), and iteratively repeating the preparation step S1, the evolution step S2 and the readout step S3, wherein the delay time period $t_i^L$ increases linearly by the same time increment $\Delta t > 0$ after each iteration, i.e., $t_i^L = t_1^L + (i-1)\Delta t$. The control and measurement unit CM is further configured to carry out the step of determining the component of the magnetic field $H_m$ in the predetermined direction according to the outcomes of the projective measurements (determination step S4).

In an exemplary embodiment, the quantum system Q is a superconducting circuit corresponding to a transmon device. The transmon device comprises a shunting capacitance and a superconducting loop interrupted by two Josephson junctions, wherein the superconducting loop is arranged such that it is threaded by the magnetic flux corresponding to the component of the magnetic field in the predetermined direction. The area of the superconducting loop is predetermined. The transmon device or the source of the magnetic field to be determined are arranged such that the normal vector of the superconducting loop corresponds to the predetermined direction. In the following, the predetermined direction corresponds to the z-direction of a Cartesian coordinate system with its origin corresponding to the geometric center of the superconducting loop. Additionally, the transmon device couples capacitively to a transmission line resonator R.

The quantum system Q is described by a qutrit (d=3) with three experimentally controllable states $|k\rangle$ ($k=\{0, 1, 2\}$). The qutrit states are the eigenstates of the component of the spin operator in the predetermined direction. Thus, the qutrit states correspond to the three projections $-\mu$, 0, $\mu$ of the magnetic moment of the transmon device. Here, the magnetic component $\mu$ of the transmon device has been measured in advance and is thus predetermined.

The Hamiltonian of the quantum system Q is given by $\hat{H} = \sum_{k=0}^{d-1} (\omega)|k\rangle\langle k|$ with the energies $E_k(\omega)$ depending on the reduced magnetic field $\omega = \mu H_m/\hbar$ and Planck's constant $\hbar$. The functional dependence of the energy level spacings $E_{k,k+1}(\omega) = E_{k+1}(\omega) - E_k(\omega)$ on the reduced magnetic field $\omega$ has been measured for a reference magnetic field and is predetermined. In particular, the energy level spacings of the quantum system Q are given by $E_{k,k+1}(\omega) = \sqrt{8E_J(\omega)E_c} - E_c(k+1)$ with the Josephson energy $E_J(\omega)$ corresponding to the Josephson junctions of the superconducting loop and being sensitive to the component of the magnetic field in the predetermined direction. The charging energy $E_c$ is obtained from the total capacitance of the transmon device. Consequently, the energy level spacings $E_{k,k+1}(\omega)$ depend identically on the reduced magnetic field $\omega$ and on the component of the magnetic field in the predetermined direction.

The control and measurement unit CM comprises a signal generator S. The signal generator S comprises an arbitrary wave generator. The signal generator S is configured to generate two-tone radio-frequency control pulses $C_1$, $C_2$, $C_3$ of rectangular shape for preparing the quantum system Q in the coherent superposition state $|\psi^0\rangle$. The signal generator S is also configured to generate two-tone radio-frequency readout pulses $R_1$, $R_2$, $R_3$ of rectangular shape for performing readout operations on the quantum system Q. Additionally, the signal generator S is configured to generate probe pulses for performing projective measurements on the quantum system Q.

The control and measurement unit CM comprises a detector D. The control and measurement unit CM and the detector D are configured to perform quantum non-demolition measurements on the quantum system Q. The control and measuring unit CM also comprises coupling means configured to couple the signal generator S with the quantum system Q (e.g., via a gate line) and with the transmission line resonator R (e.g., via a transmission line). The control and measuring unit CM also comprises coupling means configured to couple the detector D with the transmission line resonator (e.g., via a transmission line). Moreover, the control and measurement unit CM comprises an electronic evaluation unit E and an electronic storage unit. The electronic storage unit is part of the electronic evaluation unit E.

Figure 3:
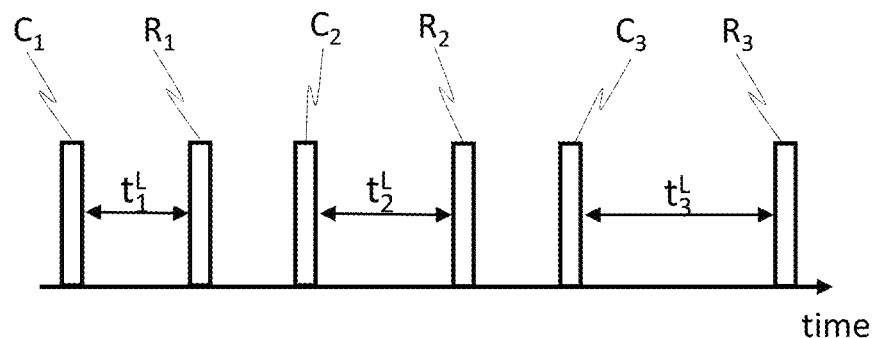
FIG. 3 shows an exemplary pulse sequence corresponding to three iterations.

FIG. 3 shows a pulse sequence generated by the signal generator S for the first three iterations (i=1, 2, 3) in the iteration loop IL. The pulse sequence comprises the control pulses $C_1$, $C_2$, $C_3$ for the preparation step S1 and the readout pulses $R_1$, $R_2$, $R_3$ for the readout operation in the readout step S3. The pulse sequence is brought into interaction with the quantum system Q via the coupling means connecting the signal generator S and the quantum system Q. The pulse durations of the control pulses $C_1$, $C_2$, $C_3$ and the readout pulses $R_1$, $R_2$, $R_3$ are considerably smaller than the delay time period $t_1^L$. The time differences between a control pulse $C_1$, $C_2$, $C_3$ and a readout pulse $R_1$, $R_2$, $R_3$ are given by the delay time periods $t_1^L$, $t_2^L = t_1^L + \Delta t$ and $t_3^L = t_1^L + 2\Delta t$, respectively. In an alternative embodiment, a delay time period $t_1^L$, $t_2^L = t_1^L + \Delta t$ and $t_3^L = t_1^L + 2\Delta t$ may also correspond to the time difference between the center of a control pulse $C_1$, $C_2$, $C_3$ and the center of a readout pulse $R_1$, $R_2$, $R_3$.

For the purpose of performing a quantum non-demolition measurement on the quantum system Q, the quantum system Q is configured to couple to the transmission line resonator R only dispersively. A resonance of the combined system (R and Q) is then probed using a probe pulse (not shown) generated by the signal generator S after a readout pulse $R_1$, $R_2$, $R_3$. The probe pulse is a microwave pulse coupling to the transmission line resonator R via a transmission line. Since the transmission line resonator R is coupled to the quantum system Q, the probe pulse probes the energy spectrum of the combined system (R and Q). The state of the quantum system Q, i.e., the measurement result of the projective measurement, is then obtained from the phase shift of the probe pulse reflected from the transmission line resonator R and measured with the detector D (dispersive readout). After each quantum non-demolition measurement, the quantum system Q relaxes again into its ground state before the next iteration starts.

In the following, further details and exemplary embodiments are provided:

In the setup step S0, the amplitudes of the coherent superposition state $|\psi^0\rangle$ are determined such that the coherent superposition state $|\psi^0\rangle$ corresponds to the maximum modulus spin-projection in the x-direction perpendicular to the predetermined z-direction. Specifically, the coherent superposition state is given by $|\psi^0\rangle = (|0\rangle + \sqrt{2}|1\rangle + |2\rangle)/2$. Thus, the coherent superposition state $|\psi^0\rangle$ is the eigenstate of the x-component $\hat{J}_x$ (or x-projection) of the spin-operator $\hat{J}$ with the largest eigenvalue 1 in terms of its absolute value. In the qutrit basis the coherent superposition state $|\psi^0\rangle$ is written as a vector $(½, 1/\sqrt{2}, ½)^T$. In an alternative embodiment, the coherent superposition state $|\psi^0\rangle$ can be written more generally as $e^{i\beta}(e^{i\lambda}/2, 1/\sqrt{2}, e^{-i\lambda}/2)^T$ with arbitrary real numbers $\beta$, $\lambda$.

In the setup step S0, the initial probability distribution of the component of the magnetic field is determined to be a Gaussian function $P^0(\omega|\emptyset) = N(\omega_R, \sigma^2)$ with a mean $\omega_R$ and the standard deviation $\sigma$. The mean $\omega_R$ corresponds to an estimated value for the component of the magnetic field obtained from a classical measurement. The standard deviation $\sigma$ corresponds to an estimated initial determination uncertainty. The time increment $\Delta t$ is obtained from the inverse of the estimated initial determination uncertainty $\sigma$ as $\Delta t = \pi/\sigma$. In an alternative embodiment, the time increment may also be chosen differently and adapted to the requirements of an apparatus. However, the time increment should ideally not deviate more than an order of magnitude from the value $\pi/\sigma$.

In the setup step S0, an expected information gain is estimated and the delay time period of the first iteration $t_1^L$ is determined according to the estimate of the expected information gain. More specifically, the delay time period of the first iteration $t_1^L$ is determined to be the saturation time of the expected information gain corresponding to the first iteration. The expected information gain is determined from a simulation of the dynamical evolution of the quantum system Q during the first iteration before the first iteration is actually carried out as explained further below in more detail.

In general terms, the information gain $\Delta I^{n+1}$ is defined as a decrease in entropy $\Delta I^{n+1} = S^n - S^{n+1}$ with $n = 0, \ldots, N-1$. Thereby, the entropy is given by the Shannon entropy in terms of a probability distribution $P^n(\omega|\{\xi_i, t_i, s_i\}_{i=1}^n)$ of the magnetic field (after n iterations) or, equivalently (up to a trivial variable transformation), the probability distribution of the reduced magnetic field $\omega$, i.e., $$S^n(\{\xi_i, t_i, s_i\}_{i=1}^n) = -\int P^n(\omega'|\{\xi_i, t_i, s_i\}_{i=1}^n) \ln P^n(\omega'|\{\xi_i, t_i, s_i\}_{i=1}^n) d\omega'$$

where $\xi_i$ labels a pure state of the quantum system Q corresponding to the outcome of the projective measurement in the i-th iteration, $t_i$ is a time corresponding to a delay time period and $s_i$ denotes a vector of experimental parameters, i.e., the frequencies of the control and readout pulses. Since the preparation step S1 and the readout operation are chosen identically in each iteration, the index on the vector can also be dropped, i.e., $s = s_i$.

For $n = 0$, the probability distribution $P^n(\omega|\{\xi_i, t_i, s_i\}_{i=1}^n)$ corresponds to the initial probability distribution $P^0(\omega|\emptyset)$. For $n > 0$, the probability distribution $P^n(\omega|\{\xi_i, t_i, s_i\}_{i=1}^n)$ is related to the probability distribution $P(\xi_n|\omega, t_n, s_n)$ of finding the quantum system Q in the pure state $|\xi n\rangle$ via Bayes theorem, i.e., via the recurrence $$P^n(\omega|\{\xi_i,t_i,s_i\}_{i=1}^n)=P^{n-1}(\omega|\{\xi_i,t_i,s_i\}_{i=1}^{n-1})$$
$$P(\xi_n|\omega,t_n,s_n)N_n,$$

where $N_n$ is a normalization factor.

In the setup step S0, the probability distributions $P(\tilde{\xi}_1|\omega, t_1, s_1)$ of finding the quantum system Q in the pure state $|\tilde{\xi}_1\rangle$ after the readout operation in the first iteration are calculated using a simulation of the dynamical evolution of the quantum system Q as explained further below. The corresponding algebraic expressions for the probability distributions are electronically stored in the electronic storage unit as a function of the reduced magnetic field (treated as a variable) for all possible pure states $\tilde{\xi}_1=\{0, 1, 2\}$.

More specifically, the dynamical evolution of the quantum system Q is simulated using a Lindblad master equation for the density matrix $\hat{\rho}$ of the quantum system Q, i.e., $$\frac{d\hat{\rho}}{dt} = -i[\hat{\rho}, \hat{H}_{int}] + \Gamma_{01}\hat{D}[\sigma_{01}]\hat{\rho} + \Gamma_{12}\hat{D}[\sigma_{12}]\hat{\rho}.$$

with the superoperator $$\hat{D}[\sigma_{ij}]\hat{\rho} = \hat{\sigma}_{ij}\hat{\rho}\hat{\sigma}_{ij}^\dagger - \frac{1}{2}\{\hat{\sigma}_{ij}^\dagger\hat{\sigma}_{ij}, \hat{\rho}\}$$

the Lindblad (jump) operators $$\hat{\sigma}_{ij}=|i\rangle\langle j|(i,j=\{0,1,2\})$$

and $\hat{H}_{int}$ denoting the Hamiltonian $\hat{H}$ written in the quantum-mechanical interaction picture (Dirac picture). In the Lindblad master equation $\Gamma_{01}$ and $\Gamma_{12}$ denote predetermined decoherence rates of the quantum system Q. They are predetermined as $\Gamma_{01}=\Gamma_{12}/\textcircled{2}=\Gamma$, where $T_c=1/\Gamma$ denotes the predetermined coherence time of the quantum system Q. In an alternative embodiment, one may also include a dephasing term in the Lindblad master equation with a predetermined dephasing rate.

The probability distributions $P(\tilde{\xi}_1|\omega, t_1, s_1)$ are then obtained from $$P(\tilde{\xi}_1|\omega,t_1,s_1)=|\langle\tilde{\xi}_1|U_{(1)}{}^r\hat{\rho}(t_1)U_{(1)}{}^{r\dagger}|\tilde{\xi}_1\rangle|^2,$$

wherein $\hat{\rho}(t_1)$ is a simulated state of the quantum system Q obtained from a solution of the Lindblad master equation for the initial coherent superposition state $\hat{\rho}^0=|\psi^0\rangle\langle\psi^0|$. Here, $t_1$ is treated as a variable for the delay time period. The unitary transformation matrix $U_{(1)}{}^{r\dagger}$ corresponds to the readout operation in the first iteration (for an explicit matrix representation see further below).

In an alternative embodiment, the probability distribution $P(\tilde{\xi}_1|\omega, t_1, s_1)$ are obtained from a simulation using the Hamiltonian for the coherent dynamics of the quantum system Q, i.e., $$P(\tilde{\xi}_1|\omega,t_1,s_1)=|\langle\tilde{\xi}_1|\psi_{t_1}\rangle|^2 \text{ with } |\psi_{t_1}\rangle=\hat{U}_{(1)}{}^r\hat{U}_{(1)}{}^e\hat{U}_{(1)}{}^p|0\rangle,$$

where the time evolution operator $\hat{U}_{(1)}{}^e=e^{-(i/\hbar)\hat{H}t_1}$ is obtained from the Hamiltonian $\hat{H}$ in the standard way. The unitary transformation matrix $U_{(1)}{}^{p\dagger}$ corresponds to (the preparation step S1 in the first iteration (for an explicit matrix representation see further below).

Since the outcome of a projective measurement is not known before an iteration is actually carried out, the expected information gain $\langle\Delta I^{n+1}\rangle$ is defined in terms of an average over all possible outcomes $\tilde{\xi}_{n+1}$, i.e., $$\langle\Delta I^{n+1}(\{\xi_i,t_i,s_i\}_{i=1}^n,\{\xi_{n+1},t,s\})\rangle = S^n(\{\xi_i,t_i,s_i\}_{i=1}^n) - \langle S^{n+1}(\{\xi_i,t_i,s_i\}_{i=1}^n,\{\xi_{n+1},t,s\})\rangle$$

where $$\langle S^{n+1}(\{\xi_i,t_i,s_i\}_{i=1}^n,\{\xi_{n+1},t,s\})\rangle = $$
$$\sum_{\xi_{n+1}=0}^{d-1}\int S^{n+1}(\{\xi_i,t_i,s_i\}_{i=1}^n,\{\xi_{n+1},t,s\})\times$$
$$P(\xi_{n+1}|\omega',t,s)P^n(\omega'|\{\xi_i,t_i,s_i\}_{i=1}^n)d\omega'.$$

In the setup step S0, the expected information gain corresponding to the first iteration $\langle\Delta I^1\rangle$ is calculated. The integral over the reduced magnetic field variable is estimated using a discretization with respect to the reduced magnetic field corresponding to an evenly spaced grid $\omega_m$ with $m=1, \ldots, M$ and $M=10^5$ points according to $$\langle\Delta I^1(\tilde{\xi}_1,t,s)\rangle = $$
$$-\sum_{m=1}^M P^0(\omega_m|\emptyset)\ln P^0(\omega_m|\emptyset) - \sum_{\xi_1=0}^2\sum_{m=1}^M S^1(\tilde{\xi}_1,t,s)P(\tilde{\xi}_1|\omega_m,t,s)P^0(\omega_m|\emptyset)$$

and $$S^1(\tilde{\xi}_1,t,s) = -\sum_{m=1}^M \frac{P^0(\omega_m|\emptyset)P(\tilde{\xi}_1|\omega_m,t,s)}{\sum_{m'=1}^M P^0(\omega_{m'}|\emptyset)P(\tilde{\xi}_1|\omega_{m'},t,s)} \times$$
$$\ln\frac{P^0(\omega_m|\emptyset)P(\tilde{\xi}_1|\omega_m,t,s)}{\sum_{m'=1}^M P^0(\omega_{m'}|\emptyset)P(\tilde{\xi}_1|\omega_{m'},t,s)}$$

Using these expression, the expected information gain $\langle\Delta I^1\rangle$ is calculated for different time arguments t. In the setup step S0, the delay time period $t_1{}^L$ is determined such that it corresponds to the time at which the expected information gain $\langle\Delta I^1\rangle$ starts to saturate, i.e., $t_1{}^L=T_s$, where $T_s$ is the saturation time of the expected information gain $\langle\Delta I^1\rangle$.

In an alternative embodiment, and for the quantum system Q corresponding to a qutrit, the delay time period $t_1{}^L$ can also be obtained from the inverse of the estimated initial determination uncertainty $\sigma$ as $t_1{}^L=\pi/(9\sigma)$. In another embodiment, and for larger pulse durations of the control and readout pulses, the delay time period $t_1{}^L$ is determined as $t_1{}^L=\max(T_s, T_p)$, wherein $T_p$ is the pulse duration of the control and readout pulses (assumed to be identical).

In the preparation step S1, the preparing of the quantum system Q in the coherent superposition state $|\psi_0\rangle$ is achieved using a control pulse $C_1, C_2, C_3$ interacting with the quantum system Q. In the iteration loop IL, the coherent superposition state $|\psi_0\rangle$ is the same in each iteration. Specifically, the preparation step S1 corresponds to a unitary transformation $|\psi_0\rangle=\hat{U}_{(i)}{}^p|0\rangle$ of the state of the quantum system Q, wherein the unitary transformation matrix is given by $$\hat{U}_{(i)}^p = \text{Exp}\left(-i\begin{bmatrix} 0 & \Delta_{1(i)}^p & 0 \\ \Delta_{1(i)}^p & 2\epsilon_{(i)}^p & \Delta_{2(i)}^p \\ 0 & \Delta_{2(i)}^p & 0 \end{bmatrix}\right)$$

The matrix elements of $\hat{U}_{(i)}^p$ are obtained from the amplitudes of the coherent superposition state $|\psi^0\rangle$ and correspond to the control pulse frequencies of a control pulse $C_1$, $C_2$, $C_3$. The control pulses $C_1$, $C_2$, $C_3$ feature the same control pulse frequencies in each iteration in the iteration loop IL.

In the evolution step S2, the quantum system Q evolves dynamically for a time given by the delay time period $t_i^L = t_1^L + (i-1)\Delta t$. Thereby, an interaction of the quantum system Q with the component of the magnetic field in the predetermined direction changes the relative phases of the state of the quantum system Q, i.e., $|\psi^0\rangle \to |\psi_i^t\rangle$, such that the qutrit state $|k\rangle$ in the coherent superposition state is expected to transform into $e^{ikD_0\omega t_i}|k\rangle$ during a time $t_i = t_i^L$, wherein $\phi_k = kD_0\omega t_i$ is the relative phase and $D_0 = \partial E_{0,1}(\omega)/\partial \omega$ denotes the derivative of the energy level spacing $E_{0,1}$ with respect to the reduced magnetic field $\omega$.

In the readout step S3, a readout operation is performed on the quantum system Q corresponding to a Fourier transform $F_3$ of the state of the quantum system Q. In each iteration, the same readout operation is performed. The readout operation corresponds to an interaction of the quantum system Q with a readout pulse $R_1$, $R_2$, $R_3$ before the projective measurement takes place. Specifically, the readout operation corresponds to a Fourier transform of the state of the quantum system Q applied to the qutrit states $|n\rangle$ with $$n = \{0, 1, 2\}, \text{ i.e., } F_d|n\rangle = (1/\sqrt{d})\sum_{k=0}^{d-1} e^{-2\pi i n k/d}|k\rangle.$$

Correspondingly, the Fourier transform corresponds to a unitary transformation $|\psi_i^f\rangle = \hat{U}_{(i)}^r |\psi_i^t\rangle$ of the state of the quantum system Q with the matrix $$\hat{U}_{(i)}^r = \operatorname{Exp}\left(-i\begin{bmatrix} 0 & \Delta_{1(i)}^r & 0 \\ \Delta_{1(i)}^r & 2\epsilon_{(i)}^r & \Delta_{2(i)}^r \\ 0 & \Delta_{2(i)}^r & 0 \end{bmatrix}\right)$$

The matrix elements of $U_{(i)}^r$ are obtained from the Fourier transform $F_3$ and correspond to the readout pulse frequencies of a readout pulse $R_1$, $R_2$, $R_3$. The readout pulses $R_1$, $R_2$, $R_3$ feature the same readout pulse frequencies in each iteration in the iteration loop IL.

In the readout step S3, a projective measurement is performed on the quantum system Q after the readout operation. The projective measurement determines the state of the quantum system $|\xi_i\rangle$. The measurement result $\xi_i$ is stored in the electronic storage unit after each iteration.

In the determination step S4, the component of the magnetic field $H_m$ is determined using a Bayesian learning algorithm. Specifically, the probability distribution of the component of the magnetic field is updated according to Bayes theorem for each iteration $$P^n(\omega|\{\xi_i,t_i,s_i\}_{i=1}^n) = P^{n-1}(\omega|\{\xi_i,t_i,s_i\}_{i=1}^{n-1}) P(\xi_n|\omega,t_n,s_n)N_n.$$

The initial probability distribution is determined in the setup step S0. In each update, the probability distribution $P(\xi_n|\omega, t_n, s_n)$ is chosen from the probability distributions of finding the quantum system in a pure state calculated in the setup step S0 (and stored in the electronic storage unit) according to the actual outcome $\xi_n$ of the projective measurement. The time argument $t_n$ in each update corresponds to a delay time period $t_i^L$. The component of the magnetic field $H_m$ is obtained from the mean value of the probability distribution of the component of the magnetic field updated according to Bayes theorem according to the measurement result of the projective measurement obtained in the last iteration.

Figure 4:
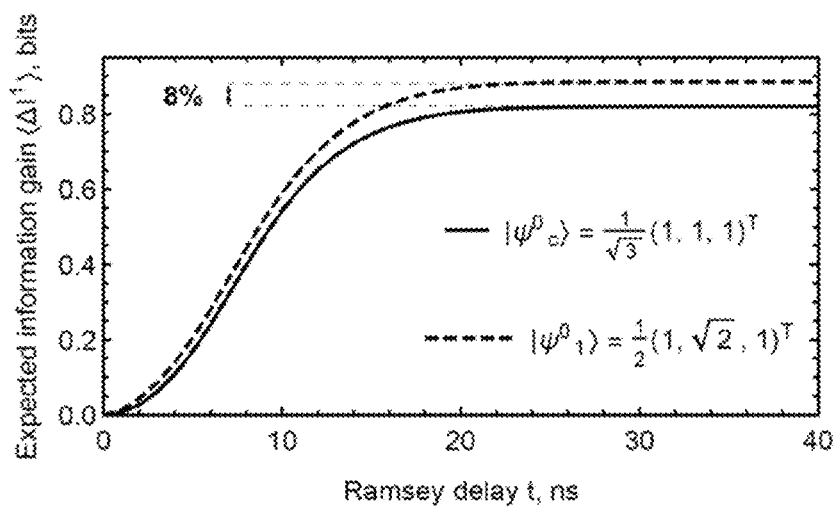
FIG. 4 shows an exemplary estimate of the expected information gain.

FIG. 4 shows an estimate of the expected information gain $\rangle\Delta I^1\langle$ for different coherent superposition states and time arguments. Here, $\omega_R=0$, $\sigma=2\pi/(90 \text{ ns})$ and $D_0=1$. The saturation time of the expected information gain is $T_s=15$ ns. Accordingly, the delay time period of the first iteration is $t_1^L=15$ ns and the time increment is $\Delta t=45$ ns. As shown in FIG. 4, the unbalanced coherent superposition state $|\psi_0\rangle = |\psi_1^0\rangle = (|0\rangle + \sqrt{2}|1\rangle + |2\rangle)/2$ leads to an increase of the expected information gain $\langle\Delta I^1\rangle$ of about 8 percent as compared to a situation where the quantum system Q is prepared in the balanced coherent superposition state $|\psi^0\rangle = |\psi_c^0\rangle = (|0\rangle + |1\rangle + |2\rangle)/\sqrt{3}$. This increase is attributed to the larger spin-polarization of the quantum system Q in the unbalanced coherent superposition state with $\rangle\psi_1^0|\hat{J}_x|\psi_1^0\langle = 1$. On the contrary, in the balanced coherent superposition state the expected value of the spin component perpendicular to the predetermined direction is $\rangle\psi_c^0|\hat{J}_x|\psi_c^0\langle = 2\sqrt{2}/3 \approx 0.94$. An increase of the expected information gain $\rangle\Delta I^1\langle$, then corresponds to a decrease of the width of the probability distribution of the component of the magnetic field and thus an increase of the determination accuracy.

Figure 5:
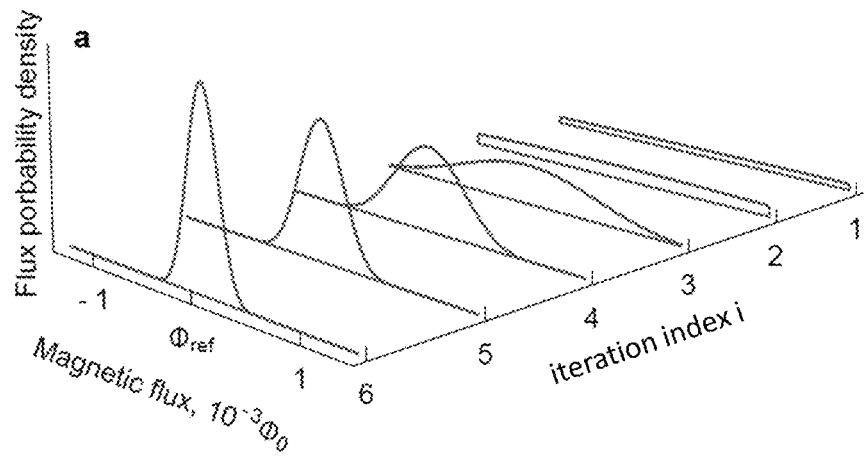
FIG. 5 shows exemplary updates of a probability distribution in the iteration loop.

FIG. 5 shows the probability distribution of the magnetic flux in the predetermined direction for the first 6 iterations. The magnetic flux corresponds to the component of the magnetic field in the predetermined direction threading the superconducting loop of the transmon device. The probability distribution of the magnetic flux thus corresponds to the probability distribution of the component of the magnetic field (up to a trivial variable transformation involving the predetermined area of the superconducting loop). In FIG. 5, the magnetic flux quantum is denoted by $\phi_0$.

Figure 6:
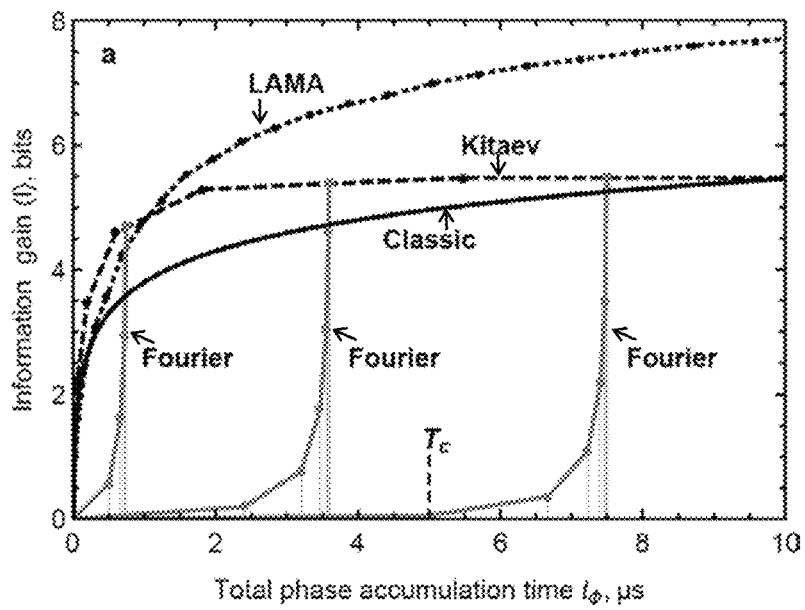
FIG. 6 shows a comparison of the information gain obtained from different methods.

FIG. 6 shows a simulation of the information gain as a function of the total phase accumulation time $$t_\phi = \sum_{i=1}^N t_i^L$$

(corresponding to different number of iterations N for fixed delay time periods $t_i^L$). The results of the proposed method are denoted by LAMA (with linearly increasing delay time periods). The LAMA method is compared with a classical protocol (with constant delay time periods), a Kitaev protocol (with exponentially increasing delay time periods) and a Fourier protocol (with exponentially decreasing delay time periods, wherein the corresponding graph in FIG. 6 starts with the longest delay time period). The maximal number of iterations considered is N=50. In FIG. 6, the actual information gain I is obtained from the width $\delta\omega(t_\phi)$ of the probability distribution of the component of the magnetic field as $I = -\ln \delta\omega(t_\phi) + \ln \delta\omega(0)$. In FIG. 6, the outcomes of the projective measurement are generated randomly and sampled from a probability distribution. The information gain shown in FIG. 6 is obtained by averaging over the results of 1000 separately simulated iteration loops IL. The results of the proposed method (LAMA) are compared with the other protocols through simulating the operations of the latter in an analogous manner, although the number of iterations has been adapted slightly as required by the underlying algorithms. In FIG. 6, a coherence time $T_c=5$ μs is predetermined. The results of the Fourier protocol are shown for three different choices of the delay time period in the first iteration. Clearly, the proposed method (LAMA)

provides a higher information gain already for total phase accumulation times smaller than the coherence time $T_c$ of the quantum system Q.

Figure 7:
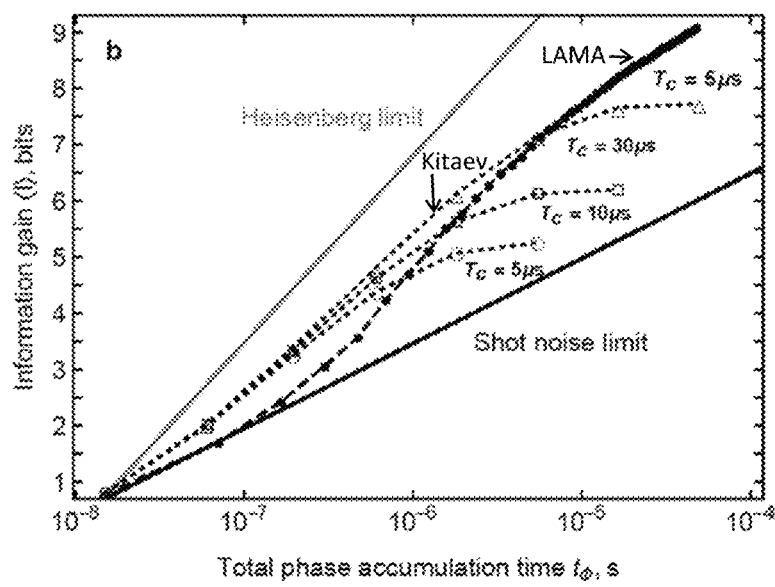
FIG. 7 shows the scaling behaviour of different methods.

FIG. 7 shows simulation results analogous to FIG. 6, but for different coherence times $T_c$. The scaling behaviour of the proposed method (LAMA) for $T_c=5$ μs (filled circles) is compared with the Kitaev protocol for $T_c=5$ μs (empty circles), $T_c=10$ μs (empty squares) and $T_c=30$ μs (empty triangles) on a lin-log plot. The scaling exponent α is obtained from fitting the dependence of the width $\delta\omega(t_\phi)$ of the probability distribution of the component of the magnetic field on the total phase accumulation time $t_\phi$, i.e., $\delta\omega(t_\phi)=1/(t_\phi)^\alpha$. As shown in FIG. 7, the Kitaev protocol approaches the Heisenberg limit for total phase accumulation times $t_\phi$ smaller than the coherence time $T_c$, but the scaling exponent almost drops to zero when the total phase accumulation time $t_\phi$ approaches the coherence time $T_c$. On the contrary, the proposed method (LAMA) becomes much more efficient when the total phase accumulation time $t_\phi$ becomes on the order of the coherence time $T_c$ and larger. In fact, a finite coherence time $T_c$ does not pose any notable limitation on the efficiency of the proposed method (LAMA) until the delay time period becomes comparable to the coherence time $T_c$.

Features of the different embodiments which are merely disclosed in the exemplary embodiments as a matter of course can be combined with one another and can also be claimed individually.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. Method for determining the component of a magnetic field in a predetermined direction, comprising the steps of:
   (S1) preparing a quantum system in a coherent superposition state,
   (S2) letting the quantum system evolve for a delay time period,
   (S3) performing a readout operation and a projective measurement on the quantum system, and
   iteratively repeating steps (S1), (S2) and (S3) in an iteration loop IL, wherein the delay time period increases linearly by the same time increment after each iteration, and
   (S4) determining the component of the magnetic field in the predetermined direction according to the outcomes of the projective measurements.

2. Method according to claim 1, wherein the coherent superposition state is the same in each iteration and/or the coherent superposition state corresponds to an unbalanced superposition of at least three states with respective amplitudes and/or the coherent superposition state corresponds to the maximum modulus spin-projection in a direction perpendicular to the predetermined direction.

3. Method according to claim 1, wherein the readout operation corresponds to a Fourier transform of the state of the quantum system.

4. Method according to claim 1, wherein the projective measurement corresponds to a measurement of the spin polarization of the quantum system in the predetermined direction.

5. Method according to claim 1, wherein the number of iterations is predetermined and/or the number of iterations is determined such that the iteration loop terminates when a delay time period becomes larger than a coherence time of the quantum system and/or the number of iterations is determined such that the total phase accumulation time is larger than at least three times a coherence time of the quantum system.

6. Method according to claim 1, wherein the method further comprises simulating a dynamical evolution of the quantum system using a Hamiltonian and/or a Lindblad master equation and determining the probability distributions of finding the quantum system in a pure state according to the simulation of the dynamical evolution of the quantum system.

7. Method according to claim 1, wherein the method further comprises estimating an initial determination uncertainty for the component of the magnetic field in the predetermined direction and determining the time increment according to the estimate of the initial determination uncertainty and/or estimating an expected information gain and determining the delay time period of the first iteration according to the estimate of the expected information gain.

8. Method according to claim 1, wherein the component of the magnetic field is determined using a Bayesian learning algorithm and/or for each iteration a probability distribution of the component of the magnetic field is updated according to Bayes theorem using a predetermined probability distribution of finding the quantum system in a pure state according to the outcome of the projective measurement and/or the component of the magnetic field is determined from the probability distribution of the component of the magnetic field updated according to Bayes theorem using the result of the projective measurement in the last iteration.

9. Computer program product stored on a non-transient computer readable medium comprising a computer program with machine-readable instructions, which, when executed by a processing system, performing a method according to claim 1.

10. Apparatus for determining the component of a magnetic field in a predetermined
direction, comprising:
a quantum system and
a control and measurement unit,
wherein the control and measurement unit is configured to carry out the steps of:
(S1) preparing the quantum system (Q) in a coherent superposition state,
(S2) letting the quantum system evolve for a delay time period,
(S3) performing a readout operation and a projective measurement on the quantum system, and
iteratively repeating steps (S1), (S2) and (S3),
wherein the delay time period increases linearly by a same time increment after each iteration, and
wherein the control and measurement unit is further configured to carry out the step of (S4) determining the component of the magnetic field in the predetermined direction according to the outcomes of the projective measurements.

11. Apparatus according to claim 10, wherein the quantum system corresponds to a d-dimensional qudit with d>2 and/or the quantum system comprises an experimentally controllable energy spectrum, wherein energy level spacings in at least a part of the experimentally controllable energy spectrum depend identically on the component of the magnetic field in the predetermined direction and/or the quantum system is a superconducting circuit.

12. Apparatus according to claim 10, wherein the control and measurement unit further comprises at least one signal generator configured to generate control pulses for preparing the quantum system in the coherent superposition state and/or readout pulses for performing readout operations on the quantum system and/or probe pulses for performing projective measurements on the quantum system.

13. Apparatus according to claim 10, wherein the control and measurement unit further comprises at least one detector and/or is configured to perform quantum non-demolition measurements on the quantum system.

14. Apparatus according to claim 10, wherein the control and measurement unit (CM) further comprises a computing unit and/or an electronic evaluation unit and/or an electronic storage unit.

15. Apparatus according to claim 10, wherein the apparatus further comprises a refrigeration unit configured to cool the quantum system into its ground state.

* * * * *